United States Patent
Yang (10) Patent No.: US 9,209,221 B2
(45) Date of Patent: Dec. 8, 2015

(54) BDI IR READOUT CIRCUIT USING PINNED PHOTODIODE AS INTEGRATION NODE

(71) Applicant: Guang Yang, Pasadena, CA (US)

(72) Inventor: Guang Yang, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 13/948,878

(22) Filed: Jul. 23, 2013

(65) Prior Publication Data
US 2014/0027640 A1 Jan. 30, 2014

Related U.S. Application Data

(60) Provisional application No. 61/675,202, filed on Jul. 24, 2012.

(51) Int. Cl.
G01J 5/20 (2006.01)
H01L 27/148 (2006.01)
H01L 27/146 (2006.01)
H04N 5/3745 (2011.01)
H04N 5/378 (2011.01)

(52) U.S. Cl.
CPC .... *H01L 27/14875* (2013.01); *H01L 27/14609* (2013.01); *H04N 5/378* (2013.01); *H04N 5/3745* (2013.01)

(58) Field of Classification Search
CPC ... G01J 5/20; H01L 27/14875; H01L 27/148; H04N 5/33
USPC .................................................. 250/338.4
See application file for complete search history.

(56) References Cited

U.S. PATENT DOCUMENTS

| | | | | |
|---|---|---|---|---|
| 6,297,070 B1 * | 10/2001 | Lee et al. | | 438/57 |
| 2009/0256156 A1 * | 10/2009 | Hsieh | | 257/72 |
| 2013/0134299 A1 * | 5/2013 | Durini Romero et al. | | 250/216 |

* cited by examiner

*Primary Examiner* — David Porta
*Assistant Examiner* — Hugh H Maupin
(74) *Attorney, Agent, or Firm* — Law Office of Scott C Harris, Inc (57) ABSTRACT

An image sensor system has an input from a photosensor, receiving photogenerated electricity, and coupling said photogenerated electricity to a first photodiode to integrate the photogenerated electricity. The photodiode can be a pinned diode, configured to act integrate charge.

12 Claims, 8 Drawing Sheets

BDI IR READOUT CIRCUIT USING PINNED PHOTODIODE AS INTEGRATION NODE

This application claims priority from Provisional application No. 61/675,202, filed Jul. 24, 2012, the entire contents of which are herewith incorporated by reference.

BACKGROUND

Typically, a buffered direct injection (BDI) Infra Red (IR) readout circuit has its widest applications in an IR readout integrated circuit (ROIC).

Figure 1:
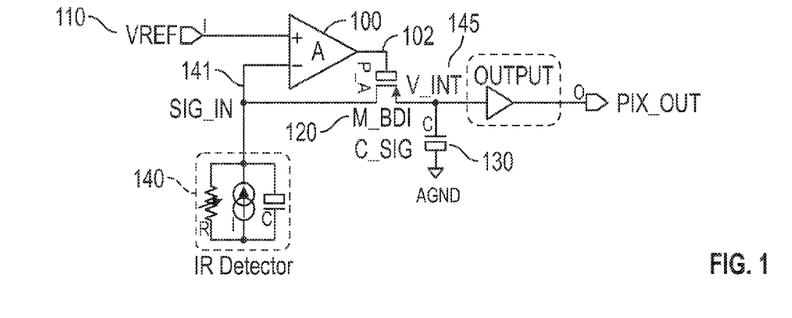
FIG. 1 shows a typical BDI circuit.

A basic BDI IR readout circuit is shown in FIG. 1. The circuit has an OPAMP 100 that biases the IR detector input at VREF 110 via the virtual ground of the opamp. The OPAMP 102 output controls the gate voltage of IR signal input gate 120, M_BDI. Typically, the BDI circuit also includes an integration capacitor 130 (C_SIG in FIG. 1) to integrate an IR signal 141 from the IR detector 140. At this circuit configuration, the IR input signal (current) is integrated on C_SIG 130 as a function of IR light intensity and integration time, while the IR detector pixel 140 is reverse biased at a known constant voltage.

At the end of integration, the IR signal, V_INT 145 is readout through the pixel OUTPUT circuit.

This BDI IR readout circuit can be improved in several ways. It can be advantageous to reduce the noise, lower the power, or minimize the pixel size of these devices. Some of the issues are listed in the following:

Low conversion gain—a BDI IR readout integrates the IR current to the integration capacitor. In order to maintain good signal linearity, a linear capacitor is desired. This can use, for example, a. MIM cap or a MOS cap based at inversion region. In standard CMOS process, the desired capacitor type has a low value limitation for device matching across the pixel array.

It can be difficult to implement correlated double sampling ("CDS") in these pixels. In sensor applications, reset noise can add a significant portion of the noise source to the signal. Correlated Double Sampling (CDS) will remove the reset noise. However, since the sampling capacitor in figure (C_SIG) is being reset before the signal integration, in-pixel CDS operation can require additional capacitor(s) and support circuits in the pixel (such as AC coupling). The additional devices limit the reduction of the pixel size.

There can also be a routing limitation. If a MIM cap is used in pixel design; it not only occupies a fairly large percentage of the pixel area, but also blocks at areas of 2 or 3 metal layer routings horizontally and vertically. This will limit the functionality of the pixel and increase cross coupling between the critical signals.

SUMMARY

To increase the gain of the pixel, the current applicant has implemented a current mirror gain to the BDI output. However, this increases the complicity of the pixel design as well.

Embodiments implement the BDI IR readout circuit using a PMOS pinned diode ("PD") CMOS sensor process. A key implementation of this invention is to use PMOS PD as an integration capacitor for the IR current.

The pinned photodiode according to an embodiment uses a CMOS image sensor process, but the pinned diode is not used as a photon sensitive element, but rather is only used as a charge integration node.

The basic pixel readout scheme follows the conventional PMOS PPD pixel CMOS sensor readout circuit with in-pixel CDS or in-pixel snapshot. Embodiments allow the pixel to have smaller size, lower noise, and more functionality.

The BDI readout scheme is widely used in IR applications, however, this invention is not necessarily limited to IR applications. The scheme of a pinned diode used as signal integration capacitor with readout circuit can apply to any integration of electrical current or charge signal.

DETAILED DESCRIPTION

This application describes an approach to combine the Buffered Direct Injection (BDI) IR readout circuit with a state-of-the-art CMOS sensor PMOS Pinned Diode (PD) process to achieve low noise, higher performance with in-pixel CDS, small pixel, and a large format IR sensor ROIC.

Figure 2:
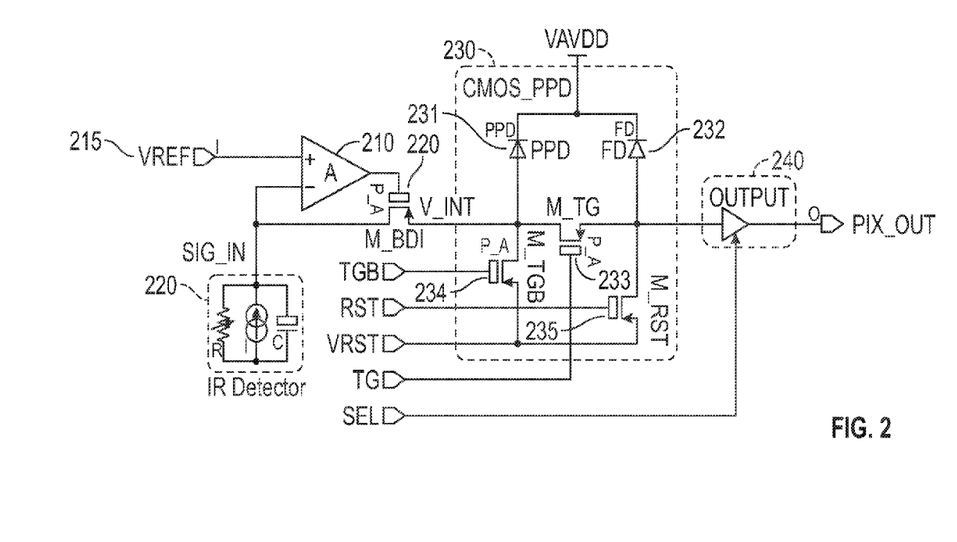
FIG. 2 shows a pixel schematic using PMOS PD to integrate the signal of BDI readout.

FIG. 2 depicts the pixel schematic block diagram of an embodiment. The IR input is the same as typical BDI circuit. The IR input 205 comes from an IR pixel 200. The IR input 205 is coupled to an operational amplifier 210 to control the IR detector bias voltage via the virtual ground input of the operational amplifier thereby biasing the pixel 200 to the reference voltage Vref 215. A gate voltage of the IR signal input gate, M_BDI 220 is also biased by the operational amplifier 210. The gate 220 connects the IR input signal to the PMOS PD circuit 230.

PMOS PD circuit 230 includes a pinned photodiode PD 231, a floating diffusion diode FD 232, a transfer gate M_TG 233, a blooming control gate M_TGB 234 (optional), and a reset gate M_RST 235. During the operation, the BDI circuit integrates the IR current in the pinned photodiode 231 after the photodiode being reset by pulsing control signals TG to the transfer gate 233 and RST to the reset gate 235. At the end of integration, the integrated charge is readout through the regular PD CMOS readout by the in-pixel buffer 240 (i.e., source follower). The blooming control gate M_TGB can also be used as second transfer gate, TG2, if the image is running in snapshot mode. A select signal SEL acts as the pixel output for readout. The input signal node, SIG_IN, is usually connected to the detector focal plane.

This embodiment brings several advantages to the IR ROIC design:

Since the pinned diode is used as the signal integration devices, no additional capacitor is needed for the pixel design in the basic pixel design.

The pinned diode is designed in the silicon substrate, and hence frees the metal space required for MIM cap. It gives much more freedom on the metal routing to implement additional functions in the pixel.

Instead of adding a gain stage to the BDI in small signal applications, the conversion gain (i.e., output electrical signal in voltage per photoelectron) of the pixel is determined by the capacitance of the floating diffusion (FD) in the PD structure. The conversion usually could be very high (60 to 100 uV/e– in CMOS sensor technology). The IR signal is integrated in the PD, which has a higher capacitance. However, the conversion gain is determined by the capacitance of the floating diffusion, which has a very low capacitance. Transfer of charge from the PD to FD is virtually a full and complete charge transfer; with no kTC noise being introduced during the reset of the transfer from the PD process. When the FD is reset to get the reset (RST) level, then the integrated charge is transferred from PD to FD through TG gate for SIG level, providing the correlated double sampling (CDS) during the pixel readout. The kTC noise is hence cancelled.

The optional blooming control gate M_TGB also functions as a charge dump gate to start the integration in snapshot mode. Thus, this type of pixel design can also perform a snapshot IR image, without CDS, however, unless an additional circuit is added.

As in some PD designs in CMOS image sensors, variable gain can be added to the pixel by varying the FD capacitance by switching in parallel capacitors.

This IR pixel embodiment will not have "fold over" problems because of the FD being blocked by IR detector on the top that no IR light will reach the FD. The saturation of the IR detector will result the PD output saturation (determined by blooming control transfer gate).

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of diodes can be used to accumulate the charge.

Figure 3:
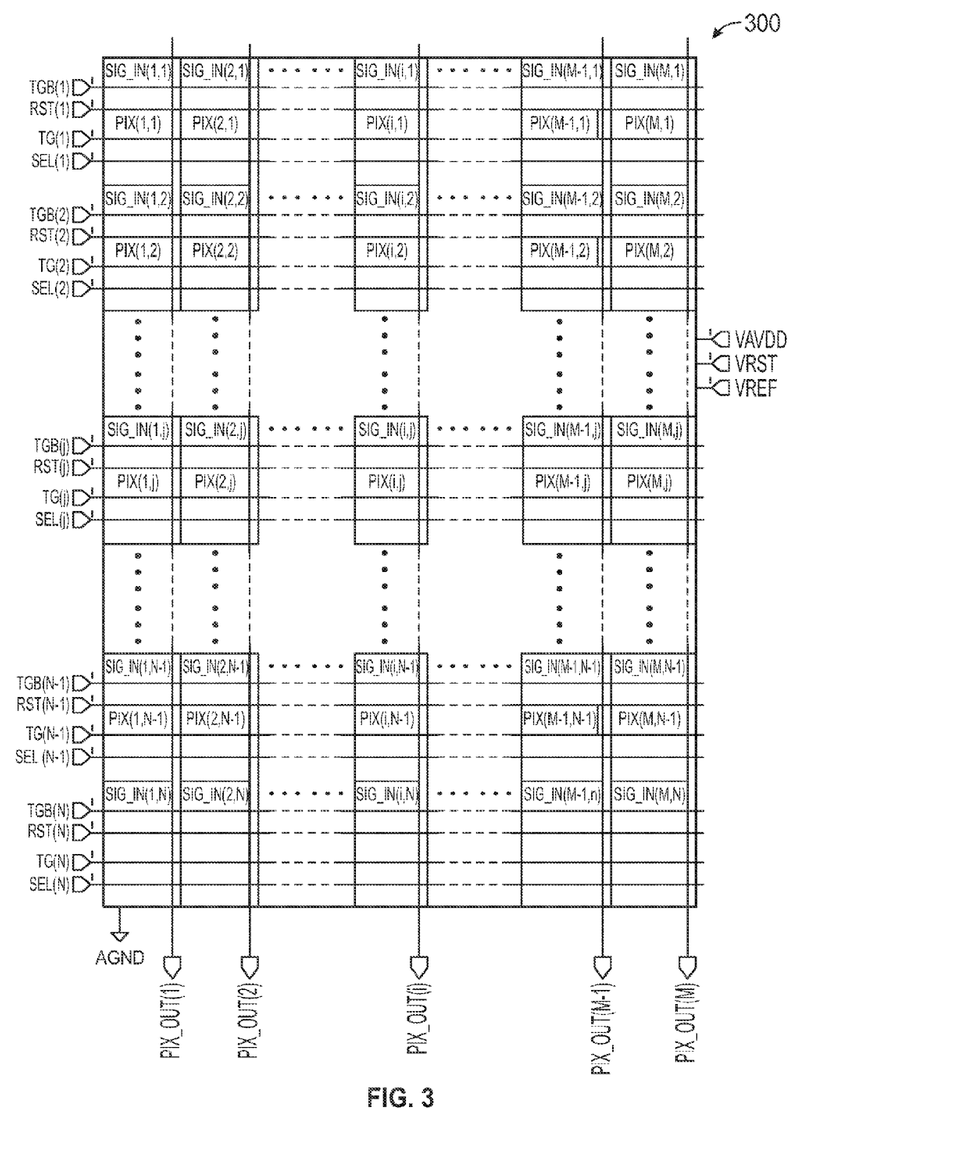
FIG. 3 shows a two-dimensional (2D) pixel array of the invented pixel with M-rows and N-columns.

The embodiments disclosed herein can be used as part of a focal plane that has a two-dimensional array of pixels. FIG. 3 depicts a M×N pixel array 300 with M columns (column[i], i=1, 2, . . . , M) and N rows (row[j], j=1, 2, . . . , N) of pixels. Signal input nodes, SIG_IN[i, j], connected to each pixel, PIX[i, j]. The power supply VAVDD, pixel reset voltage VRST, reference voltage VREF, and pixel ground AGND, are global input voltages for the entire pixel array. The row based control signals are, TGB[j], RST[j], TG[j], and SEL[j], j=1, 2, . . . , N. The pixel output is column based, PIX_OUT[i], i=1, 2, . . . , M. Since this is a PMOS pixel, all the control signals of the pixel array are active LOW.

Figure 4:
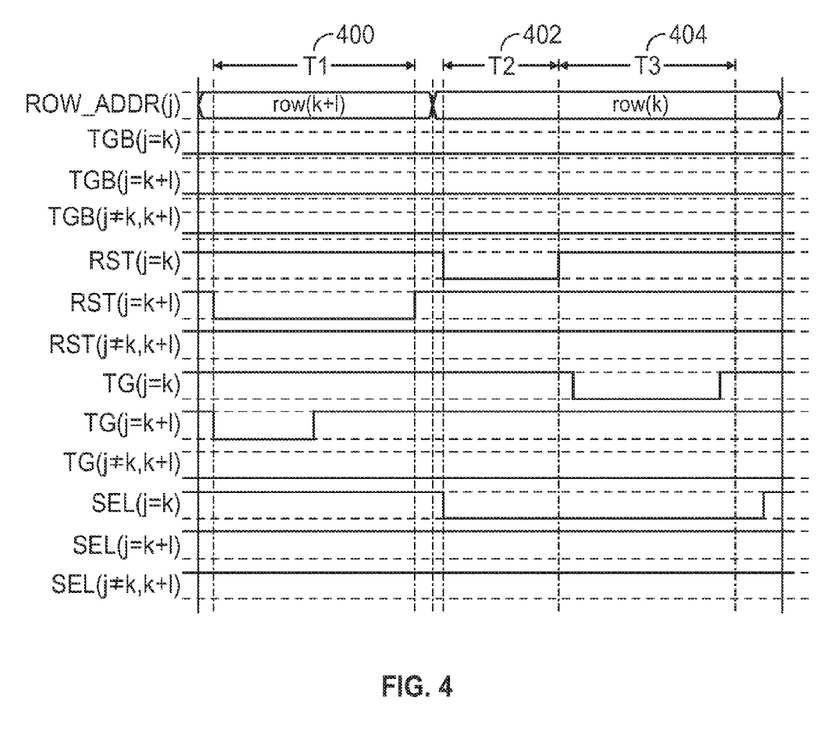
FIG. 4 shows the pixel operation control waveform of BDI readout circuit using PMOS PD to integrate the signal charge in rolling shutter mode.

FIG. 4 shows the timing control of the BDI readout circuit using a PMOS PD to integrate the signal charge operating in rolling shutter mode. The pixel integration time can be programmed as a number of row times. Pixel integration of one row is shown in FIG. 4. In FIG. 4: T1 400 is the time when the pixel in row[k+1] is reset to start the integration. T2 402 is the time after one row of integration time when the floating diffusion diodes of the pixel in row[k] are reset and the reset level are readout; and T3 404 is the integrated signals in the PMOS pinned diode of row[k] which are transferred to the floating diffusion diode when the signal level are readout.

Figure 5:
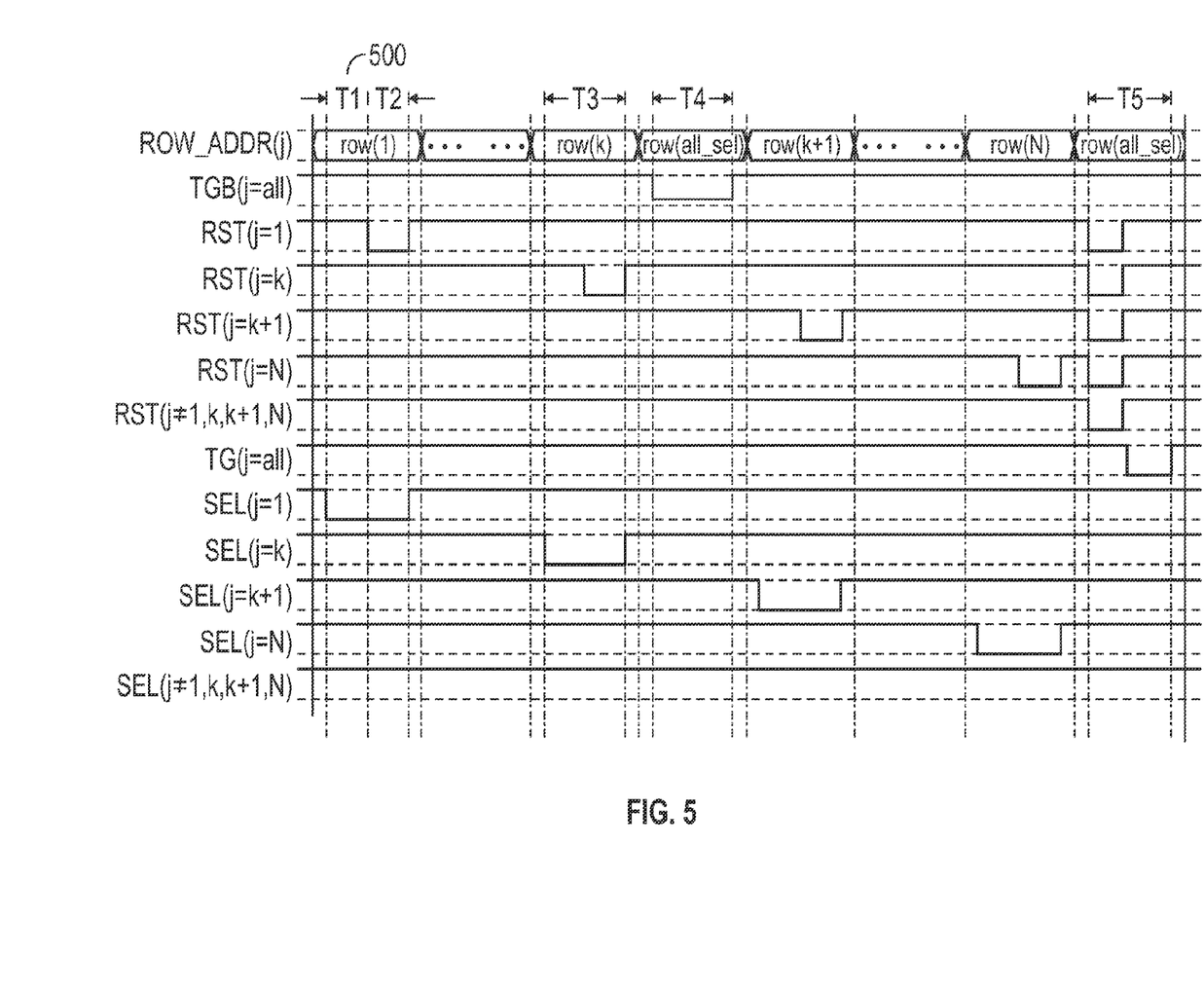
FIG. 5 shows the pixel operation control waveform of BDI readout circuit using PMOS PD to integrate the signal charge in global mode.

FIG. 5 shows the timing control of the BDI readout circuit using PMOS PD to integrate the signal charge operating in global shutter mode. After all the signals are transferred to and stored in the floating diffusion diode, the pixel array starts the readout sequence. When T1 500 for row[1] is selected, read out the signal level stored in floating diffusion diode of pixels in row[1]; T1—reset the floating diffusion diode of pixels in row[1], and read out the reset level of the floating diffusion diode of pixels in row[1]; T3—signal and reset levels read out of row[k]; T4—select all rows, globally reset the PMOS pinned diode of entire pixel array; and T5—select all rows, globally reset the floating diffusion diode of entire pixel array, then globally transfer the integrated signal from PMOS pinned diode to floating diffusion diode.

When the pixel operates in global shutter mode, the signal stored in floating diffusion diode is read out first, follows by the read out of the reset level. The pixel is not operating in correlated double sampling mode so that the kTC noise could be very high.

Figure 6:
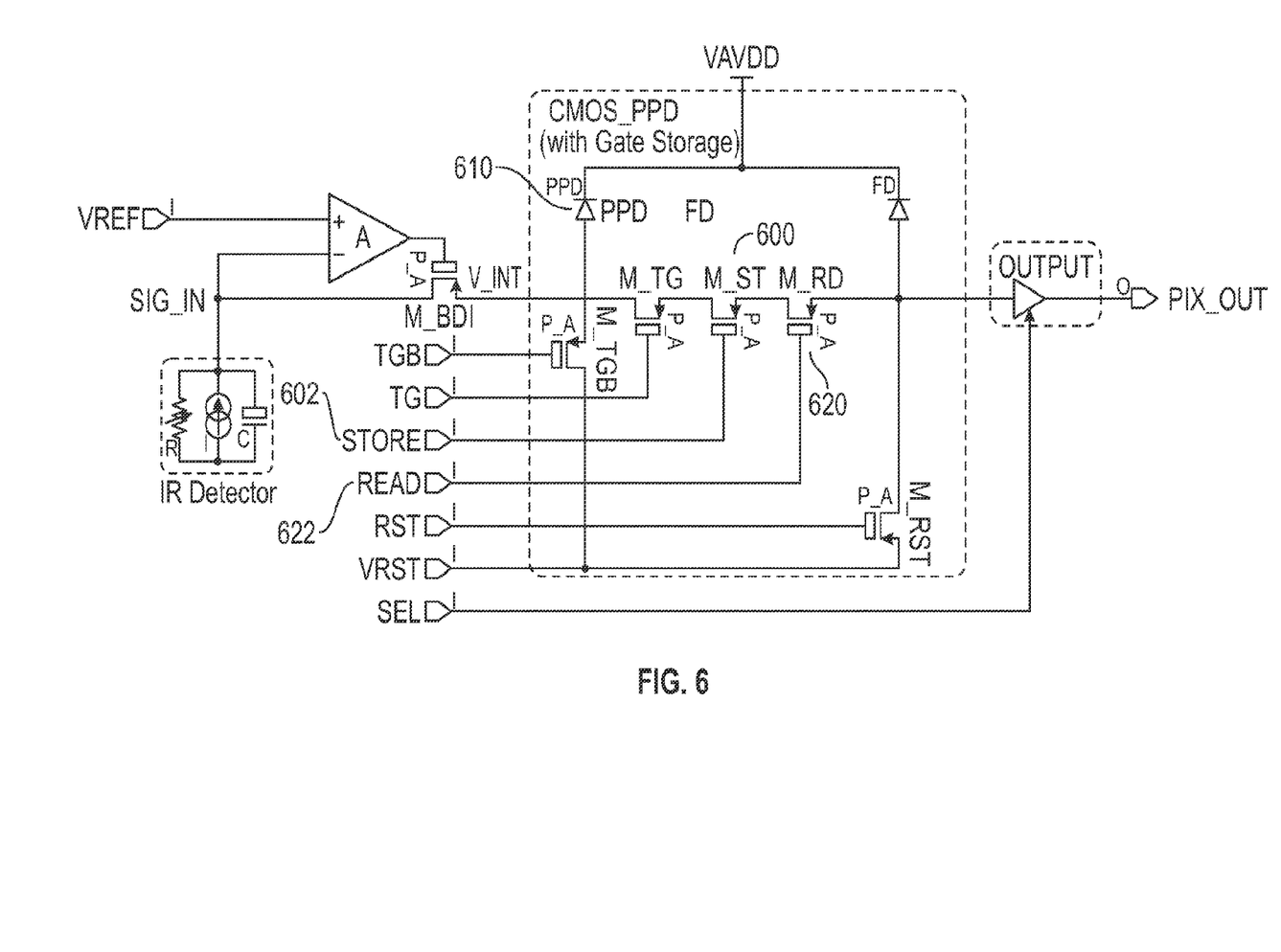
FIG. 6 shows an extended invention with additional storage gate for global shutter with correlated double sampling application.

FIG. 6 depicts an alternative embodiment with an additional storage gate for global shutter to carry out a correlated double sampling application. Two more transistors are added to the pixel: M_ST 600, controlled by signal STORE 602, forms the storage gate that stores the signal charge from the PMOS pinned diode 610. The transistor 620; M_RD is controlled by signal READ 622 and forms another gate separate from the signal storage gate M_ST and floating diffusion diode 630.

Figure 7:
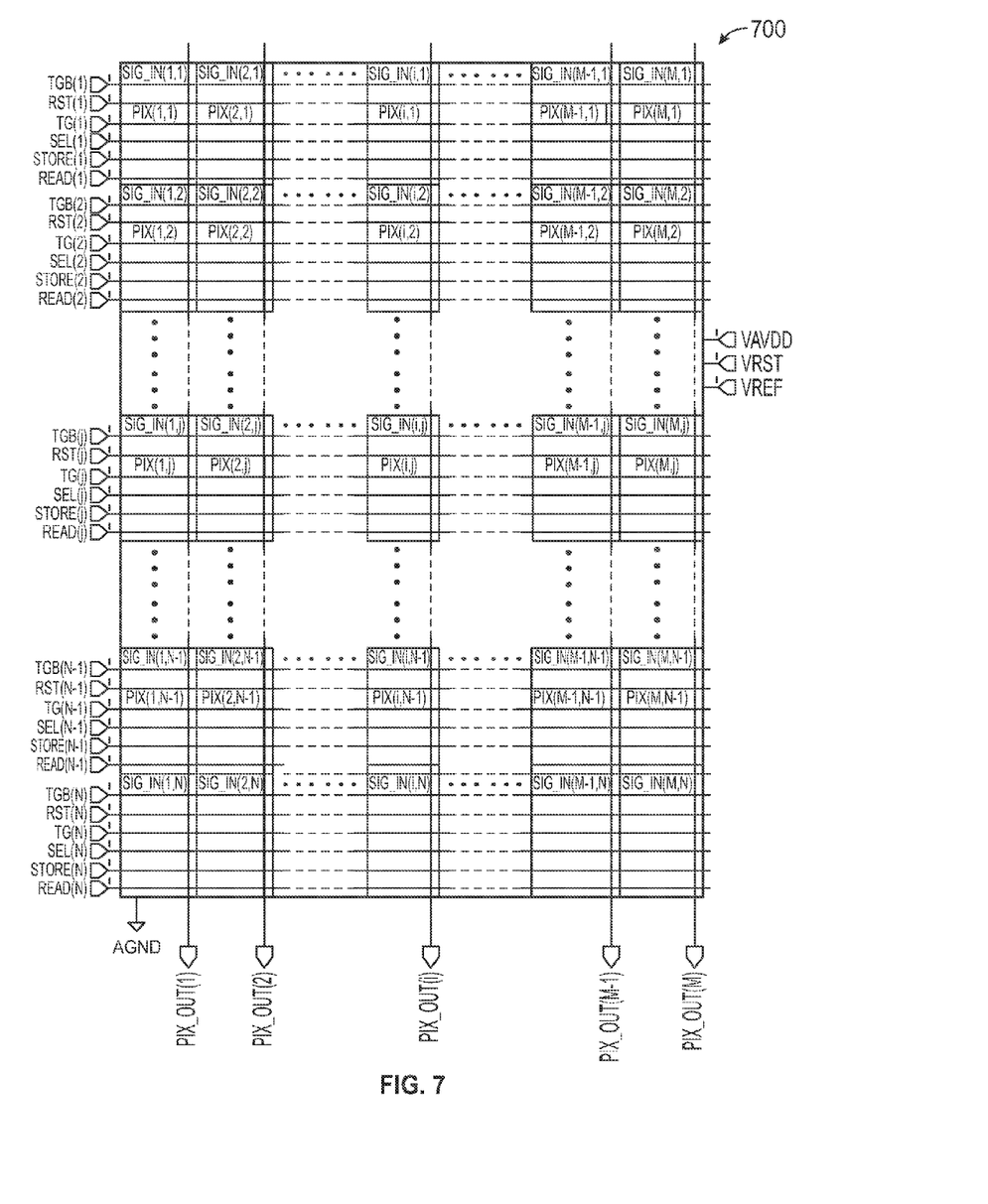
FIG. 7 shows a two-dimensional (2D) pixel array of the extended invention with M-rows and N-columns.

FIG. 7 shows an M×N pixel array 700 of BDI readout circuit using PMOS PD integration nodes with additional storage gate for global shutter applications. The additional control signals are in row based, they are STORE[j] and READ[j], j=1, 2, . . . , N.

Figure 8:
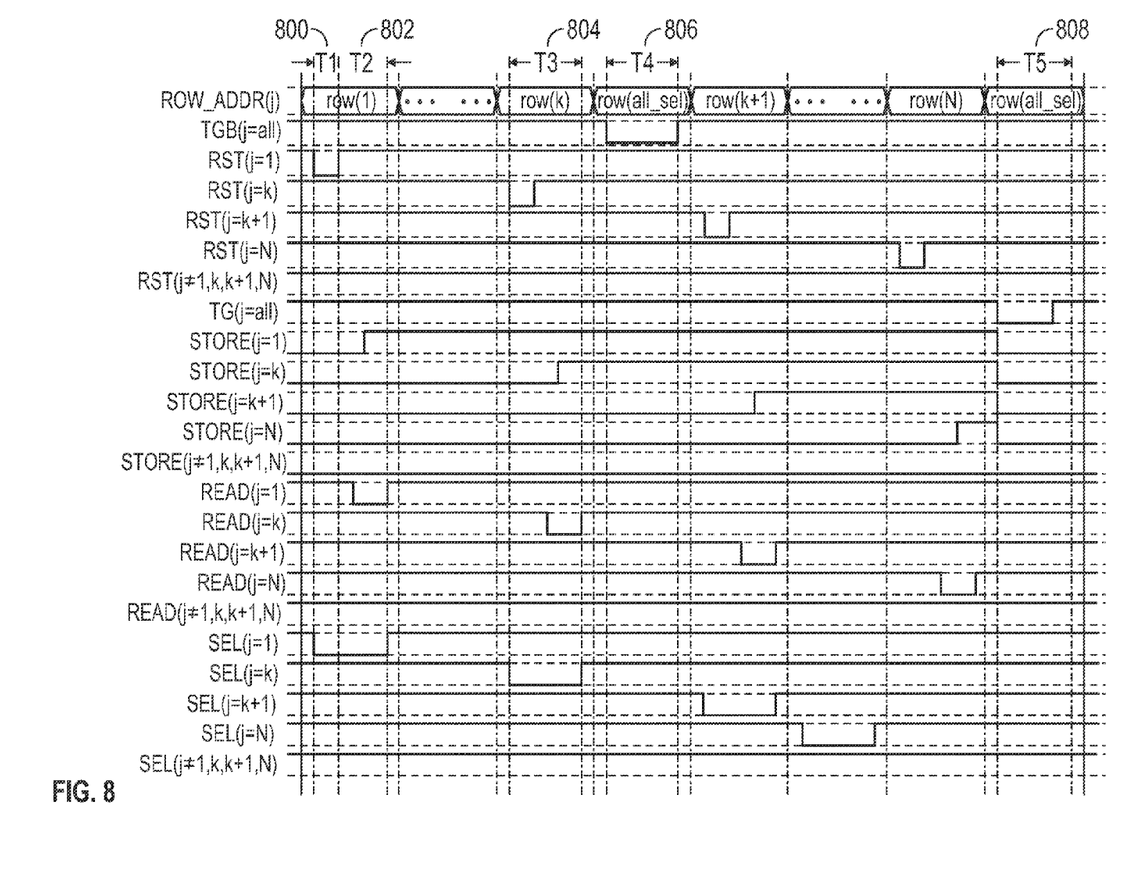
FIG. 8 shows the pixel operation control waveform of the global shutter and CDS operation pixel.

FIG. 8 shows the pixel timing waveform of BDI readout circuit using the PMOS PD integration node with additional storage gate for global shutter applications. After all the signals are transferred to and stored in the storage gate, the pixel array starts the readout sequence. T1 800 resets the floating diffusion diode of the pixels in row[1]. The reset level is read out at T2 802. The signal charge in the storage gate of pixels in row[1] is transferred to the floating diffusion diode by pulsing the M_RD gate in the pixel, and the signal levels of the pixels in row[1] transferred to the floating diffusion diodes are read out. At T3 804, the reset and signal levels of pixels in row[k] are read out. At T4 806, all rows are selected, and TGB[j] pulse resets the PMOS pinned diode to start the pixel integration globally. At T5 808, after the signal levels in the last row, row[N] are read out, all rows are selected. The M_ST gate is turned on, and the TG[j] gate is pulsed globally to transfer and store the signal charge integrated in the PMOS pinned diode to the storage gate.

Figure 9:
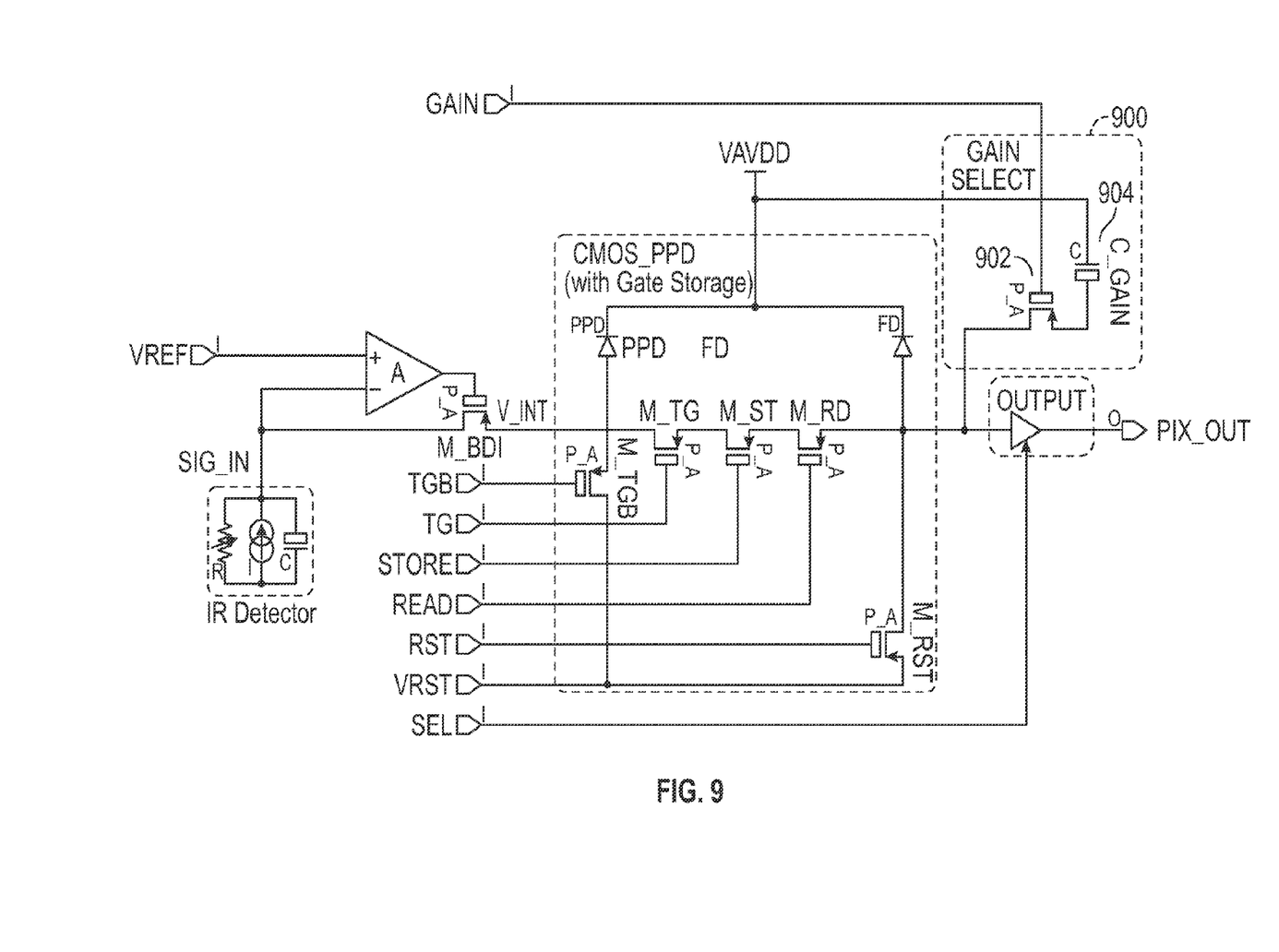
FIG. 9 shows the schematic of an embodiment that uses programmable gain.

FIG. 9 depicts yet a further embodiment to the pixel. A gain selection block 900 is added that includes a gain select switch(s) 902 and capacitor(s) 904, in parallel with the floating diffusion diode 910. In this way, the conversion gain of the pixel could be programmable, according to the signal strength. For the pixel to handle high signal strength, a higher full well signal is associated to a lower conversion gain.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor can be used to control the operation, or alternatively the operation can be controlled by a controller. The processor may be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An image sensor system comprising:
an input receiving photogenerated electricity, and coupling said photo generated electricity to a first photodiode to integrate said photogenerated electricity in said first photodiode as an integrated value;

a transfer gate, which is in a first state that prevents the integrated value from passing, and in a second state that allows the integrated value to pass;

a second gate that stores charge from the integrated value when transferred via the transfer gate;

a third gate that in a first state that prevents the charge on the second gate from passing, and in a second state that allows the charge on the second gate to pass;

a second diode, receiving the charge stored in the third gate when the third gate allows the charge to pass, and accumulating electricity transferred from the transfer gate, said second diode connected to an output where said output produces a value indicative of a reset value at a first time and produces an output indicative of the photogenerated electricity at a second time.

2. The image sensor system as in claim 1, wherein said input and output are inputs and outputs of a single pixel, and there are multiple pixels in the system forming an array.

3. The image sensor system as in claim 1, wherein said first photodiode is a pinned photodiode.

4. The image sensor system as in claim 3, wherein said second diode is a floating diffusion diode.

5. The system as in claim 1, wherein the input includes an operational amplifier with a first input bias of a reference voltage, and a second input connected to a photodetector to bias said photodetector.

6. The system as in claim 5, wherein said photodetector is an infrared photodetector.

7. The system as in claim 6, wherein the operational amplifier has an output that biases a follower gate that receives said photogenerated electricity from said infrared photodetector.

8. The system as in claim 1, further comprising a reset gate that resets a level on said second diode.

9. An image sensor system comprising:

an input receiving photogenerated electricity, and coupling said photo generated electricity to a pinned photodiode, to integrate said photogenerated electricity in said pinned diode as an integrated value;

a transfer gate, which is in a first state that prevents the integrated value from passing, and in a second state that allows the integrated value to pass;

a second diode, receiving the integrated value from the transfer gate, and accumulating charge transferred from the transfer gate, said second diode connected to an output that produces an output indicative of the photogenerated electricity; and a blooming control gate that prevents a level of the integrated value stored in said pinned photodiode from exceeding a specified level and is also operable in a snapshot mode as a transfer gate.

10. An image sensor device, comprising:

a node, receiving a signal from a photodetector with a charge amount based on an amount of received photons;

a pinned diode, separate from the photodetector, and operating as an integration node to accumulate the charge from said node;

an operational amplifier; and a transfer gate, driven by an output of the operational amplifier to couple said signal from said node to said pinned diode, wherein said operational amplifier also holds said node at a virtual voltage level, a second gate that stores charge from the pinned diode when transferred via the transfer gate; and a third gate that in a first state that prevents the charge on the second gate from passing, and in a second state that allows the charge on the second gate to pass;

an output node that outputs a value indicative of a reset value at a first time and outputs a value indicative of the amount of received photons at a second time.

11. The device as in claim 10, wherein said virtual voltage level is at a reference voltage.

12. The device as in claim 10, further comprising a blooming control gate, which prevents reception of signals higher than a specified amount and is also operable in a snapshot mode as a transfer gate.

* * * * *